United States Patent
Coronel et al.

(10) Patent No.: US 7,556,995 B2
(45) Date of Patent: Jul. 7, 2009

(54) MOS TRANSISTOR MANUFACTURING

(75) Inventors: Philippe Coronel, Barraux (FR); Claire Gallon, Grenoble (FR); Claire Fenouillet-Beranger, Grenoble (FR)

(73) Assignees: STMicroelectronics Crolles 2 SAS, Crolles (FR); Commissariat a l'Energie Atomique, Paris Cedex (FR)

( * ) Notice: Subject to any disclaimer, the term of this patent is extended or adjusted under 35 U.S.C. 154(b) by 68 days.

(21) Appl. No.: 11/604,462

(22) Filed: Nov. 27, 2006

(65) Prior Publication Data

US 2007/0122975 A1 May 31, 2007

(30) Foreign Application Priority Data

Nov. 28, 2005 (FR) .................................. 05 53615

(51) Int. Cl.
*H01L 21/336* (2006.01)
*H01L 21/3205* (2006.01)

(52) U.S. Cl. ................. 438/197; 438/274; 438/510; 438/585; 257/E21.177; 257/E21.428; 257/E21.429

(58) Field of Classification Search ............ 438/197, 438/274, 510, 585; 257/E21.177, E21.428, 257/E21.429, E21.43

See application file for complete search history.

(56) References Cited

U.S. PATENT DOCUMENTS

| 5,670,387 | A | 9/1997 | Sun |
| 6,114,768 | A | 9/2000 | Gaul et al. |
| 6,335,214 | B1 | 1/2002 | Fung |
| 6,838,332 | B1 | 1/2005 | Sanchez et al. |
| 7,176,116 | B2 * | 2/2007 | Cabral et al. ............. 438/586 |
| 2003/0064553 | A1 | 4/2003 | Iashi |
| 2005/0042867 | A1 | 2/2005 | Sanchez et al. |
| 2007/0117294 | A1 | 5/2007 | Kim .................... 438/197 |
| 2007/0232003 | A1 * | 10/2007 | Loo et al ............... 438/283 |

OTHER PUBLICATIONS

French Search Report from corresponding French Application No. 05/53615 filed Nov. 28, 2005.

* cited by examiner

*Primary Examiner*—Scott B. Geyer
*Assistant Examiner*—Mohsen Ahmadi
(74) *Attorney, Agent, or Firm*—Lisa K. Jorgenson; James H. Morris; Wolf, Greenfield & Sacks, P.C.

(57) ABSTRACT

A MOS transistor made in monolithic form, vias contacting the gate and the source and drain regions of the transistor being formed on the other side of the channel region with respect to the gate.

7 Claims, 2 Drawing Sheets

MOS TRANSISTOR MANUFACTURING

BACKGROUND OF THE INVENTION

1. Field of the Invention

The present invention generally relates to the manufacturing in monolithic form of MOS transistors. More specifically, the present invention relates to the manufacturing of transistors of small dimensions.

2. Discussion of the Related Art

FIGS. 1A and 1B are cross-section views illustrating different steps of the forming of the contacts of a MOS transistor according to a known method.

As illustrated in FIG. 1A, the transistor is formed in an active region of a semiconductor layer 1 on an insulator 2 (SOI), insulator 2 resting on a support 3. Active region 1 is delimited by an insulation periphery 4. Source and drain regions 5 are formed on either side of an insulated gate 7 provided with lateral insulating spacers 9. The entire transistor is embedded in an interlevel insulator. Typically, the interlevel insulator is formed of two successive insulating layers of different natures, a lower layer 11 and an upper level 13 having a planar upper surface.

At the steps illustrated in FIG. 1B, insulating layers 11 and 13 are opened at two selected locations to partially expose source/drain regions 5. The openings thus formed are then filled with a conductive material, typically metallic, such as tungsten, aluminum, copper, or an alloy of one or several of these metals. Vias 15 are thus formed. A contact with gate G is also simultaneously formed.

A disadvantage of such a method lies in the need to provide a lateral guard between the walls of gate 7 and contacts 15. This guard is necessary to avoid a short-circuit between gate 7 and a source/drain region 5 in case of a misalignment of the mask of definition of vias 15.

Since transistors are used as base elements to form a great number of components (resistors, diodes, switches) or circuits (memories, image sensors ... ), it is desirable to decrease their dimensions.

SUMMARY OF THE INVENTION

An object of the present invention is to provide a method for manufacturing in monolithic form MOS transistors which enables decreasing the transistor dimensions.

Another object of the present invention is to provide a MOS transistor structure which exhibits small dimensions.

To achieve these and other objects, the present invention provides a method for manufacturing a MOS transistor, vias contacting the gate and the source and drain regions of the transistor being formed on the other side of the channel region with respect to the gate.

According to an embodiment of the present invention, the method comprises the steps of:

forming the insulated gate above a portion of a semiconductor layer of a first conductivity type delimited by a periphery;

forming in the layer amorphous regions on either side of a central region of the layer underlying the gate;

turning over the entire structure;

totally etching the amorphous regions, whereby recesses are formed between the central region and the periphery; and depositing in the recesses only a conductive material capable of forming the source and drain regions of the transistor.

According to an embodiment of the present invention, the step of totally etching the amorphous regions is preceded by a step of forming and selectively etching a first insulating layer so that the layer only remains in place in the form of a block on the central region.

According to an embodiment of the present invention, the step of depositing the material in the recesses only is followed by the steps of:

depositing an interlevel layer so that its surface is planar;

opening the interlevel insulating layer at three locations to partially expose the gate and the source and drain regions; and filling the previously-formed openings in the interlevel insulating layer with a conductive material, whereby three vias contacting the gate and the source and drain regions of the transistor are formed.

According to an embodiment of the present invention, the step of forming the amorphous regions comprises the implantation of a dopant in the semiconductor layer in self-aligned fashion with respect to the gate.

According to an embodiment of the present invention, the semiconductor layer is made of silicon and has a thickness ranging between 5 and 15 nm, the dopant for forming the amorphous regions being germanium implanted at a dose of approximately $10^{15}$ at./cm$^2$, at an energy ranging between 3 and 8 keV.

According to an embodiment of the present invention, the step of turning over the entire structure comprises the steps of:

depositing an insulating material so that its upper surface is planar;

depositing a substrate on insulator so that the insulator rests on the surface of the insulating material; and turning over the assembly.

According to an embodiment of the present invention, after forming of the vias contacting the gate and the source and drain regions of the transistor, the insulating block is replaced with a conductive element insulated from the underlying central region.

The present invention also provides a MOS transistor made in monolithic form, vias contacting the insulated gate and the source and drain regions of the transistor being formed on the opposite side of the channel region with respect to the gate.

The present invention also provides a random access static memory, comprising at least one transistor according to the present invention.

The foregoing and other objects, features, and advantages of the present invention will be discussed in detail in the following non-limiting description of specific embodiments in connection with the accompanying drawings.

DETAILED DESCRIPTION

Figure 1A:
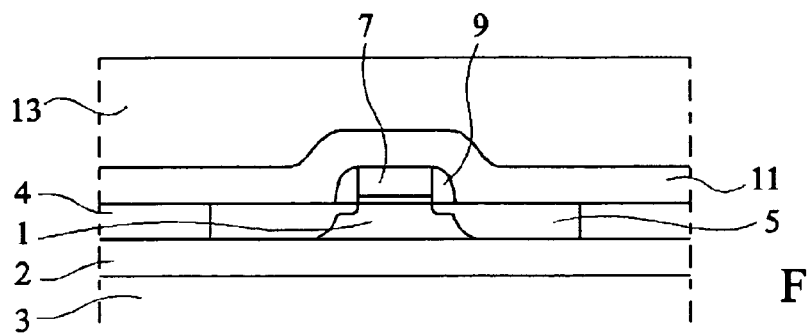
FIGS. 1A and 1B are cross-section views illustrating steps of forming of a MOS transistor according to a known method.
Figure 1B:
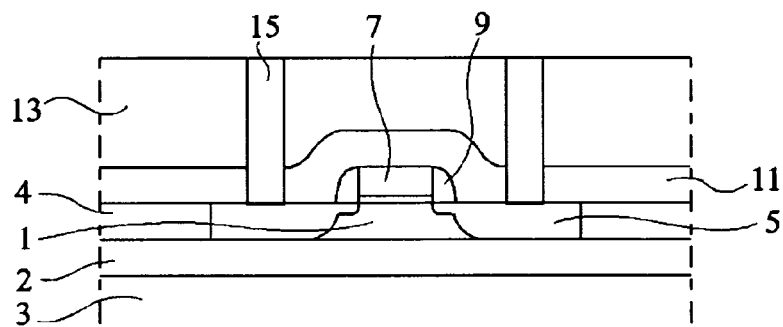

For clarity, the same elements have been designated with the same reference numerals in the different drawings and, further, as usual in the representation of integrated circuits, the various drawings are not to scale.

FIGS. 2A to 2I illustrate, in cross-section view, different steps of a method for manufacturing in monolithic form a MOS transistor according to an embodiment of the present invention.

Figure 2A:
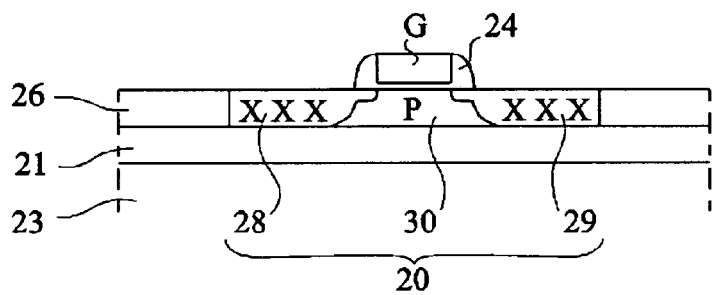
FIGS. 2A to 2I are cross-section views illustrating steps of forming of a MOS transistor according to an embodiment of the present invention.

As illustrated in FIG. 2A, the method starts with the forming of an insulated gate G above a semiconductor layer 20 on an insulator 21. Insulator 21 rests on a support 23, for example, a semiconductor wafer. Gate G is provided with lateral spacers 24. Gate G is formed on a portion of an active region of layer 20 defined by an insulating periphery 26. An implantation at very high dose is then performed, during which gate G is used as a mask, to make the regions 28 and 29 of layer 20 located between periphery 26 and the region under gate G amorphous. Channel region 30 underlying gate G is not affected by this implantation. For example, layer 20—and thus, region 30—is of a first conductivity type, for example, P. The selection of the type and of the doses of the implanted dopants will be detailed hereafter. It should however already be noted that after implantation, amorphous regions 28 and 29 exhibit a difference in optical properties—reflection—difference and an etch selectivity with respect to central region 30.

Figure 2B:
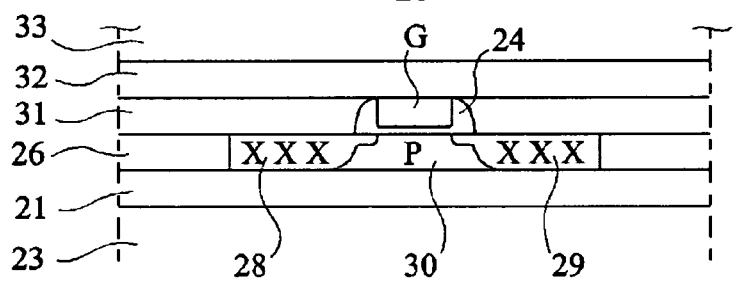

At the next steps, illustrated in FIG. 2B, an insulating layer 31 is deposited and leveled so that its upper surface is planar. A semiconductor substrate 33 is then added with an interposed insulating bonding layer 32.

Figure 2C:
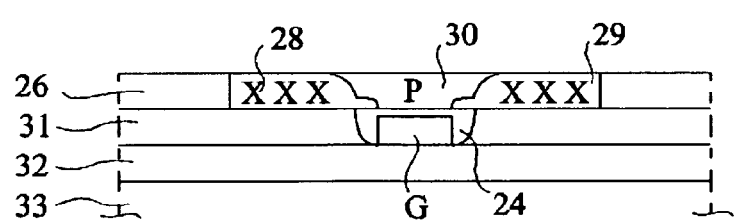

As illustrated in FIG. 2C, the structure of FIG. 2B is then turned over so that substrate 33 is at the rear surface, in the low portion of FIG. 2C. Support 23 is then eliminated.

Figure 2D:
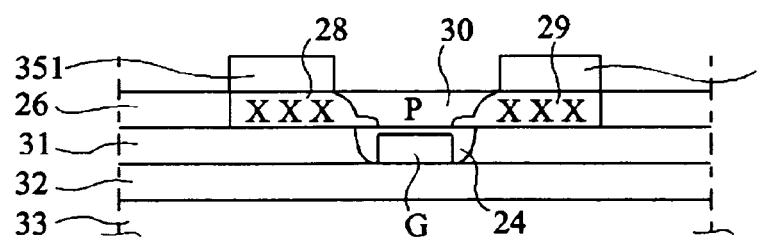

Then, as illustrated in FIG. 2D, in the case where layer 21 has also been eliminated, an insulating layer is deposited and etched to only leave in place blocks 351 and 352 on each of amorphous regions 28 and 29. Blocks 351 and 352 are formed by means of an etch mask, the alignment of which is made possible by the reflection differences existing between amorphous regions 28 and 29 and single-crystal region 30.

Figure 2E:
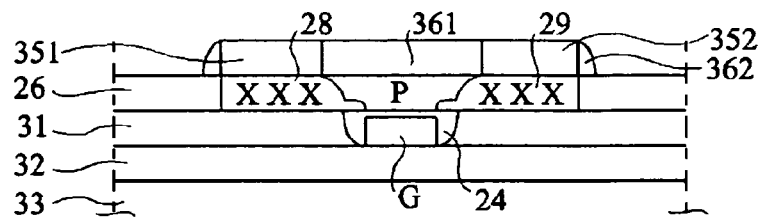

At the next steps, illustrated in FIG. 2E, an insulating layer is deposited and etched to only leave in place a block 361 above gate G between blocks 351 and 352. In practice, as illustrated in FIG. 2E, the forming of block 361 may go along with the forming on periphery 26 of a spacer 362 outside of lateral blocks 351 and 352. Such a spacer 362 can be kept with no effect on the device operation.

However, as illustrated in FIGS. 2F to 2I, such a spacer 362 may also not form, or be eliminated by an appropriate wet etch before carrying on with the method according to the present invention.

Figure 2F:
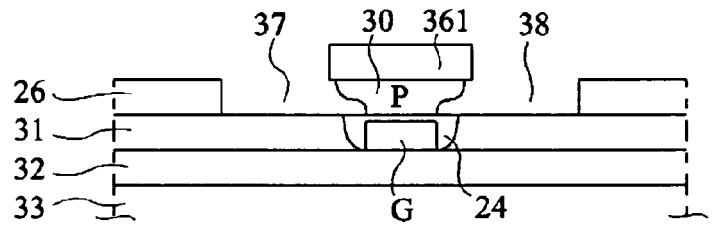

Then, as illustrated in FIG. 2F, central block 361 and periphery 26 are used as masks in a selective etch capable of eliminating lateral blocks 351 and 352 as well as amorphous regions 28 and 29. The types and concentrations of the dopants of regions 28 and 29 will have been selected so that, during this etch, lightly-doped single-crystal channel region 30 of the first conductivity type, for example, P, is left in place. Two recesses 37 and 38 are then formed on either side of the channel region 30 underlying block 361.

Figure 2G:
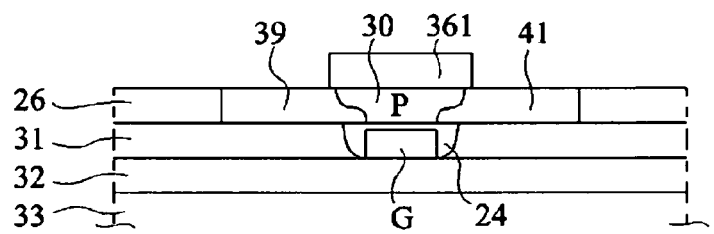

At the next steps, illustrated in FIG. 2G, recesses 37 and 38 are filled with a material capable of forming source and drain regions 39 and 41 of the transistor.

According to an embodiment, the material deposited in recesses 28 and 29 is metallic, such as a metal silicide, for example, nickel silicide or tungsten silicide.

According to a variation, the material deposited in recesses 28 and 29 is a semiconductor material which grows by selective lateral epitaxy from region 30. Such a semiconductor for example is silicon- or silicon-germanium-doped of the conductivity type opposite to that of channel region 30. After epitaxy, the semiconductor is siliconized at its surface or, preferably, across its entire thickness.

Figure 2H:
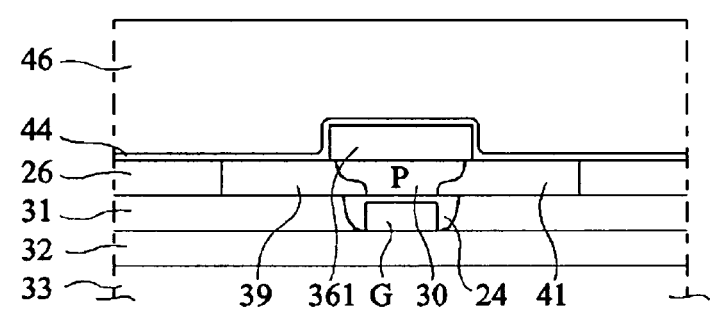

Then, as illustrated in FIG. 2H, the entire structure is covered with an interlevel insulating layer so that its upper surface is substantially planar. Preferably, the interlevel layer is a multiple-layer formed of a conformal lower layer 44 and of an upper layer 46. Layers 44 and 46 are insulating, selectively etchable with respect to each other. Further, lower layer 44 is selectively etchable with respect to the material forming gate, source, and drain regions G, 39, and 41.

Figure 2I:
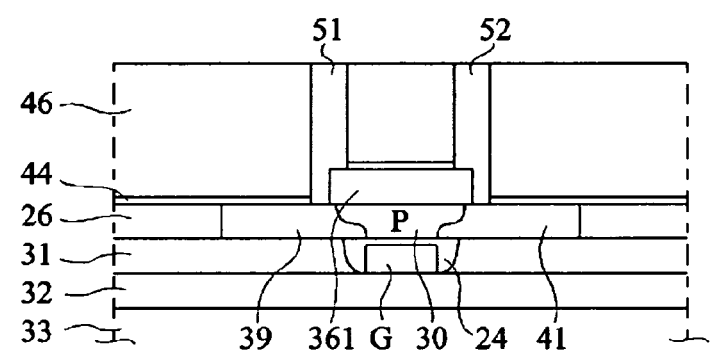
Figure 3:
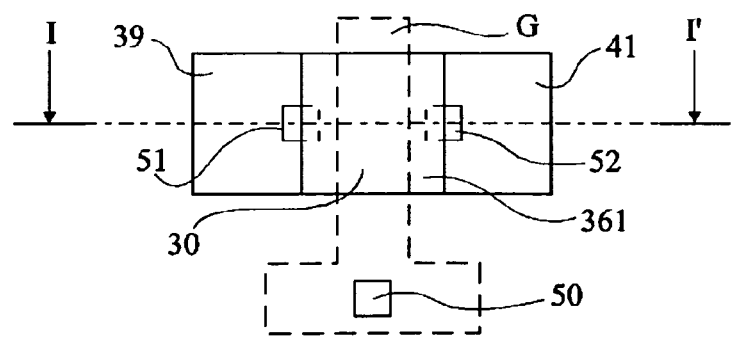
FIG. 3 is a simplified top view of an internal portion of the structure of FIG. 2I.

The rest of the method for manufacturing an MOS transistor according to an embodiment of the present invention will be described in relation with the cross-section view of FIG. 2I and with the top view of FIG. 3, FIG. 2I being a cross-section of FIG. 3 along axis I-I' crossing channel region 30 and regions 39 and 41 perpendicularly to gate G.

Layers 46 and 44 are open at three distinct locations opposite to regions 39 and 41 and gate G. As illustrated in FIG. 3, the opening intended to partially expose gate G is hollowed outside of the region vertically above channel region 30. The three openings are filled with a conductive material, preferably metal, to form a via 50 in contact with gate G and vias 51 and 52 in contact with source and drain regions 39 and 41.

An advantage of the method according to the present invention is that, on simultaneous forming of the two openings partially exposing each of regions 37 and 38, block 361 is used as an etch stop and enables avoiding, in case of a misalignment of the etch mask, a short-circuiting of gate G and of a source or drain region 39 or 41. This enables not using the conventional guards intended to avoid forming of such short-circuits. This is illustrated by the fact that openings 51 and 52 are placed in partially overlapping position on the channel area.

Another advantage of the method according to the present invention is that, when the gate dimensions are decreased, the obtained structure exhibits a decreased risk of parasitic capacitive coupling between gate G and vias 51 and 52 of source 39 and drain 41. Indeed, vias 51 and 52 are no longer formed close to gate G.

It is thus possible to decrease the integration surface area of a MOS transistor. For example, the method according to the present invention enables decreasing by 35% the surface area taken up by an elementary cell of a static-type RAM (SRAM) in a 45-nm technology.

According to an embodiment of the present invention, amorphous regions 28 and 29 are formed in a lightly-doped P-type single-crystal silicon layer 20 of a thickness from 5 to 15 nm, for example, approximately 10 nm, by implanting germanium at a dose greater than approximately $5.10^{14}$ at./cm$^2$, for example $1.10^{15}$ at./cm$^2$, and at an energy ranging between 3 and 8 keV, for example, approximately 5 keV.

The material forming etch stop block 361 is selected especially according to the following constraints. Block 361 should be selectively etchable with respect to regions 28 and 29 and to periphery 26 and to the insulating material forming blocks 351 and 352. For example, blocks 351 and 352 and periphery 26 are made of silicon oxide (SiO$_2$), layer 20 is made of single-crystal silicon, and block 361 is made of silicon nitride (Si$_3$N$_4$) and has a thickness from 50 to 200 nm.

The interlevel insulating layer then for example comprises a lower silicon nitride layer 44 (Si$_3$N$_4$) 44 with a thickness from 10 to 25 nm and an upper silicon oxide layer 46 having a thickness on the order of 300 nm.

It will be within the abilities of those skilled in the art to complete the method according to the present invention described in relation with FIGS. 2A to 2I and 3 with the standard steps of the used technological process.

According to an embodiment of the present invention, block 361 may be used to form any appropriate element. For example, after simultaneous forming of contacts 50, 51, and 52, insulating block 361 may be replaced with a metal ground plane. For this purpose, layers 44 and 46 are opened to have access to block 361 and a selective etch capable of totally eliminating block 361 is performed. An insulator is then deposited over all the walls of the recess thus formed and the remaining cavity is filled with a conductive material capable of forming a ground plane. Preferably, after having filled the low cavity portion with a conductor, the top of the opening is filled with an insulator identical to peripheral insulator 46.

The presence of the ground plane enables modifying the threshold voltage of the transistor. Such a modification depends on the nature of the conductor forming the plane. Further, the presence of such a plane ensures an electrostatic control function by compensating for short channel effects.

According to another embodiment, it is possible to replace insulating block 361 with a metal structure before forming of contacts 50, 51, and 52, after deposition of interlevel insulating layer 44-46.

Of course, the present invention is likely to have various alterations, modifications, and improvements which will readily occur to those skilled in the art. In particular, it will be within the abilities of those skilled in the art to bring all the material and thickness modifications necessary in a given technological process. Thus, in the former example, block 361 is, like layer 44, silicon nitride. Their relative thicknesses are then selected, as well as the conditions, especially the etch duration, to avoid etching block 361 or to only negligibly etch it on opening of layer 44 to form contacts 50, 51, and 52. However, layer 44 and block 361 may be selectively-etchable insulators, such that block 361 is little or not etched on opening of layer 44 to form contacts 50, 51, and 52. The thickness of block 361 may then be selected within a narrower range ranging from 10 to 100 nm. Lower layer 44 will then preferably have a thickness ranging from 35 to 100 nm.

Further, it will be within the abilities of those skilled in the art to select according to the nature and to the thickness of layer 20 the features of the implantation—dopant type, dose, and power—adapted to forming amorphous regions 28 and 29.

It will also be within the abilities of those skilled in the art to adjust, if need be, the doping levels and the complementary N or P types of channel and source and drain regions 30 and 39 and 41 according to the transistor type and to the wanted electric performances.

It should be noted that "semiconductor layer" is used to designate a uniformly-doped silicon wafer as well as epitaxial areas and/or areas specifically doped by diffusion/implantation formed on or in a solid substrate.

Generally, although the present invention has been described in the context of a silicon process, it applies to any integrated circuit manufacturing process.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing a MOS transistor, wherein vias contacting the gate and the source and drain regions of the transistor are formed on the other side of the channel region with respect to said gate and comprising:
   forming an insulated gate above a portion of a semiconductor layer of a first conductivity type delimited by a periphery;
   forming in the layer amorphous regions on either side of a central region of the layer underlying the gate;
   turning over the entire structure;
   totally etching the amorphous regions, whereby recesses are formed between the central region and the periphery; and
   depositing in the recesses only a conductive material capable of forming the source and drain regions of the transistor.

2. The method of claim 1, wherein the step of totally etching the amorphous regions is preceded by a step of forming and selectively etching a first insulating layer so that the layer only remains in place in the form of a block on the central region.

3. The method of claim 2, wherein after forming of the vias contacting the gate and the source and drain regions of the transistor, the insulating block is replaced with a conductive element insulated from the underlying central region.

4. The method of claim 1, wherein the step of depositing the material in the recesses only is followed by the steps of:
   depositing an interlevel layer so that its surface is planar;
   opening the interlevel insulating layer at three locations to partially expose the gate and the source and drain regions; and
   filling the previously-formed openings in the interlevel insulating layer with a conductive material, whereby three vias contacting the gate and the source and drain regions of the transistor are formed.

5. The method of claim 1, wherein the step of forming the amorphous regions comprises the implantation of a dopant in the semiconductor layer in self-aligned fashion with respect to the gate.

6. The method of claim 5, wherein the semiconductor layer is made of silicon and has a thickness ranging between 5 and 15 nm, the dopant (28, 29) for forming the amorphous regions being germanium implanted at a dose of approximately $10^{15}$ at./cm$^2$, at an energy ranging between 3 and 8 keV.

7. The method of claim 1, wherein the step of turning over the entire structure comprises the steps of:
   depositing an insulating material so that its upper surface is planar;
   depositing a substrate on insulator so that the insulator rests on the surface of the insulating material; and
   turning over the assembly.

* * * * *